(12) United States Patent
Pillow

(10) Patent No.: US 10,090,472 B2
(45) Date of Patent: Oct. 2, 2018

(54) METHOD OF TREATING A POLYMER

(71) Applicants: Cambridge Display Technology Limited, Godmanchester (GB); Sumitomo Chemical Company Limited, Tokyo (JP)

(72) Inventor: Jonathan Pillow, Godmanchester (GB)

(73) Assignees: Cambridge Display Technology Limited, Godmanchester (GB); Sumitomo Chemical Company Limited, Tokyo (JP)

(*) Notice: Subject to any disclaimer, the term of this patent is extended or adjusted under 35 U.S.C. 154(b) by 0 days.

(21) Appl. No.: 14/968,483

(22) Filed: Dec. 14, 2015

(65) Prior Publication Data

US 2016/0190459 A1    Jun. 30, 2016

(51) Int. Cl.
  *C08G 61/12*    (2006.01)
  *H01L 51/00*    (2006.01)
  *C09K 11/06*    (2006.01)
  *C08G 61/02*    (2006.01)
  *H01L 51/50*    (2006.01)

(52) U.S. Cl.
  CPC .......... *H01L 51/0039* (2013.01); *C08G 61/02* (2013.01); *C09K 11/06* (2013.01); *H01L 51/0025* (2013.01); *H01L 51/0043* (2013.01); *C08G 61/12* (2013.01); *C08G 2261/12* (2013.01); *C08G 2261/144* (2013.01); *C08G 2261/1422* (2013.01); *C08G 2261/18* (2013.01); *C08G 2261/3142* (2013.01); *C08G 2261/3162* (2013.01); *C08G 2261/3424* (2013.01); *C08G 2261/5222* (2013.01); *C08G 2261/726* (2013.01); *C08G 2261/80* (2013.01); *C08G 2261/95* (2013.01); *H01L 51/5012* (2013.01)

(58) Field of Classification Search
  CPC ................................ C08G 61/12; C08G 61/02
  See application file for complete search history.

(56) References Cited

U.S. PATENT DOCUMENTS

2016/0161475 A1* 6/2016 Chiu ...................... C09K 11/06
                                                         506/9

FOREIGN PATENT DOCUMENTS

| WO | WO 2008/042783 A1 | 10/2008 |
| WO | WO 2013/191086 A1 | 12/2013 |

OTHER PUBLICATIONS

Office Communication dated Apr. 1, 2015 for Great Britain Application No. GB1423178.1.

* cited by examiner

*Primary Examiner* — Margaret G Moore
(74) *Attorney, Agent, or Firm* — Wolf, Greenfield & Sacks, P.C.

(57) ABSTRACT

A method of fractionating a semiconducting polymer wherein the semiconducting polymer comprises polymer chains comprising a defect group, the method comprising the steps of reacting the polymer chains comprising a defect group to form polymer chains comprising separating groups; and separating the polymer chains comprising the separating groups from the semiconducting polymer. The separating group may be a binding group X capable of binding to a solid substrate material 305, for example particulate silica.

16 Claims, 7 Drawing Sheets

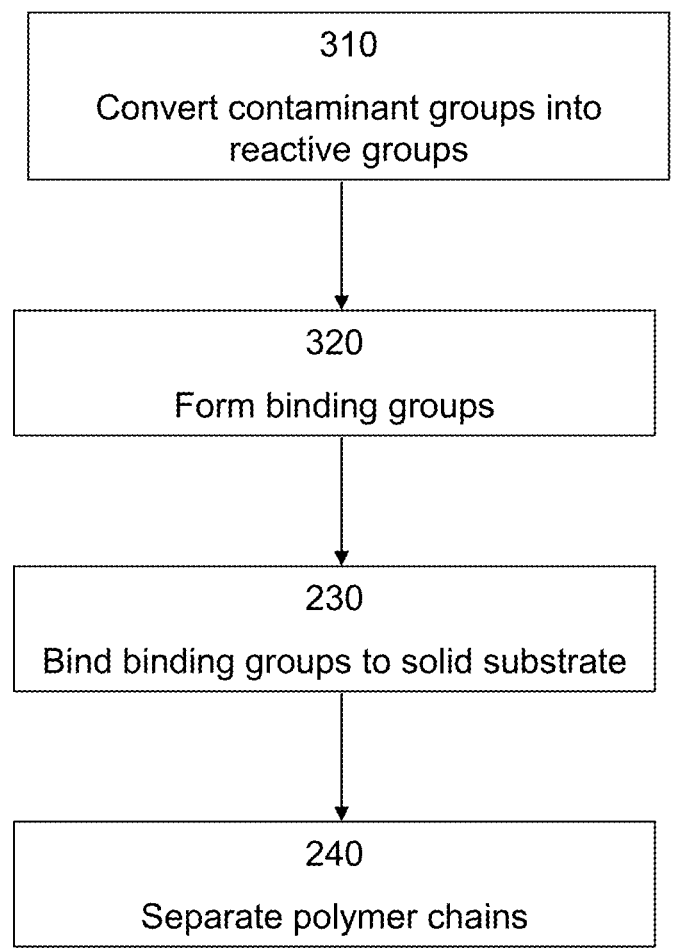

METHOD OF TREATING A POLYMER

RELATED APPLICATIONS

This application claims the benefits under 35 U.S.C. § 119(a)-(d) or 35 U.S.C. § 365(b) of British application number 1423178.1, filed Dec. 24, 2014, the entirety of which is incorporated herein.

BACKGROUND

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED comprises an anode, a cathode and one or more organic light-emitting layers between the anode and cathode. Non-emissive layers, for example charge transporting layers and charge transporting layers, may be provided between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Suitable light-emitting materials include small molecule, polymeric and dendrimeric materials. Suitable light-emitting polymers include poly(arylene vinylenes) such as poly(p-phenylene vinylenes) and polyarylenes such as polyfluorenes.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

It is an aim of the present invention to provide a OLED device with an improved properties for instance an improved device lifetime.

SUMMARY OF THE INVENTION

The invention provides a method of treating a semiconducting polymer wherein the semiconducting polymer comprises polymer chains comprising a defect group, the method comprising the steps of reacting the polymer chains comprising a defect group to form polymer chains comprising separating groups; and separating the polymer chains comprising the separating groups from the semiconducting polymer.

DESCRIPTION OF THE DRAWINGS

The invention will now be described in more detail with reference to the drawings in which:

FIG. 3A is a flowchart of a process for treating a polymer by selectively binding polymer chains carrying defect groups to a solid substrate;

DETAILED DESCRIPTION

Figure 1:
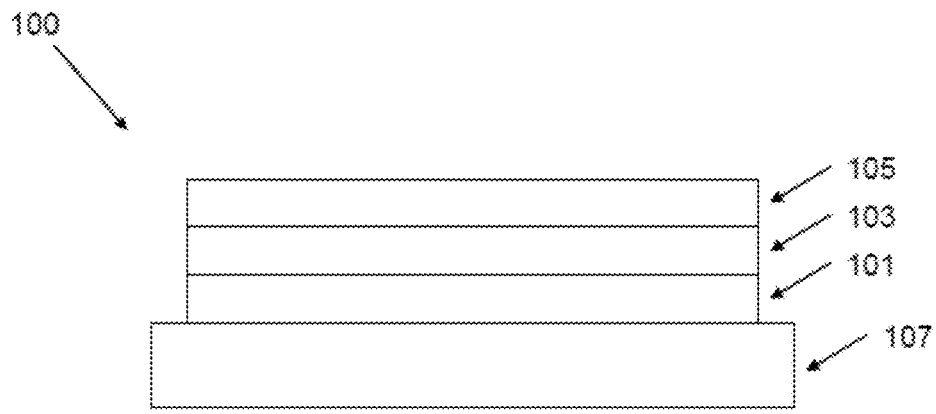
FIG. 1 illustrates schematically an OLED according to an embodiment of the invention.

With reference to FIG. 1, an OLED 100 according to an embodiment of the invention has an anode 101, a cathode 105 and a light-emitting layer 103 between the anode and the cathode. The device is supported on a substrate 107, which may be a glass or plastic substrate.

One or more further layers may be provided between the anode and the cathode. Optionally, further layers may be selected from one or more of a hole-injection layer, a hole-transporting layer, an electron-blocking layer, a electron-transporting layer and an electron blocking layer.

Light-emitting layer 103 may contain one or more fluorescent light-emitting materials, one or more phosphorescent light-emitting materials or a combination of at least one fluorescent light-emitting material and at least one phosphorescent light-emitting material.

The OLED may contain more that one light-emitting layer, for example a plurality of light-emitting layers that together produce white light.

Exemplary OLED layer structures include the following:
Anode/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, a hole-injection layer is present between the anode and the light-emitting layer.

Preferably, a hole-transporting layer is present between the anode and the light-emitting layer.

Preferably, both of a hole-injection layer and a hole-transporting layer are present.

At least one of the layers comprises a semiconducting polymer, preferably a conjugated polymer.

A semiconducting polymer used in an OLED may be, without limitation, a hole-transporting material of a hole-transporting layer or a light-emitting layer; an electron-transporting material of an electron-transporting layer or a light-emitting layer; a light-emitting material; or a host material used with a light-emitting dopant. Preferably, at least one of a hole-transporting layer and a light-emitting layer comprises a semiconducting polymer.

Conjugated polymers comprise repeat units in the polymer backbone that are conjugated to adjacent repeat units in the polymer backbone. Preferably, arylene or heteroarylene groups of a repeat unit are directly linked by a single bond to arylene or heteroarylene groups of an adjacent repeat unit.

Semiconducting polymers may contain repeat units having defect groups.

Defect groups include, without limitation, groups formed in a side-reaction during formation of a monomer wherein monomers containing defect groups are not separated from the rest of the monomers prior to polymerisation; groups formed by a reaction of a monomer before polymerisation or during polymerisation, for example a residual leaving group that remains bound to a repeat unit of the polymer following polymerisation of monomers carrying leaving groups, for example halogenated monomers, or a group formed by reaction of a monomer with water or oxygen; or defect groups of a repeat unit formed by a reaction of the repeat unit after polymerisation, for example a group formed by reaction of a repeat unit with water or oxygen.

Defect groups of a semiconducting polymer may have a detrimental effect on performance of an organic electronic device containing the polymer, even at low defect concentrations (e.g. less than 1 mol % or less than 0.1 mol % of the total number of polymeric repeat units). It will be understood that defect groups as described herein are covalently bound to the polymer as distinct from impurities that may be mixed with the polymer.

Exemplary defect groups include, without limitation:
acidic groups, for example O—H, N—H and acidic C—H groups;
halides, optionally chlorine, bromine or iodine; and
C═O groups, in particular ketone and aldehyde groups.
A —$CH_2$— group of a monomer or a repeat unit that is adjacent to at least one aryl or heteroaryl group may be particularly susceptible to free-radical or ionic reactions that result in formation of defect groups.

Treatment as described herein reduces the proportion of polymer chains carrying one or more defect groups in a semiconducting polymer. A semiconducting polymer may be substantially free of the one or more defect groups following treatment as described herein.

The treated polymer may contain a plurality of different defects and the polymer treated as described herein may still contain one or more of the defects. The polymer may undergo only one treatment, or may undergo least two different treatments to remove two or more different defects. Any defects that have little or no detrimental effect on the properties of the polymer may remain in the polymer without specific treatment to remove those defects.

Figure 2:
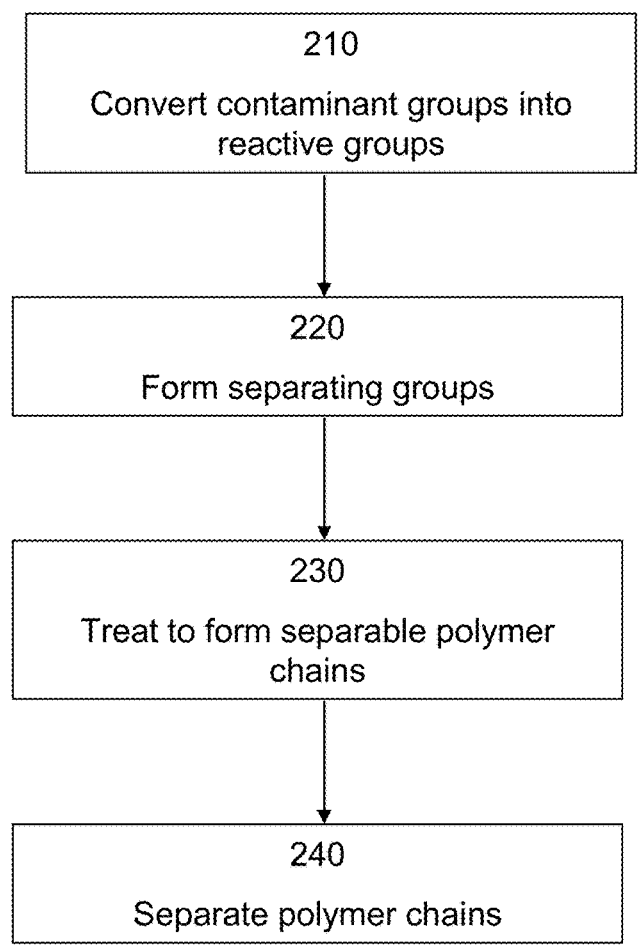
FIG. 2 is a flowchart of a process according to an embodiment of the invention.

FIG. 2 is a flowchart of a process for selectively removing polymer chains containing defect groups from a semiconducting polymer according to an embodiment of the invention.

In an optional step 210, a semiconducting polymer containing a proportion of polymer chains having defect groups is treated to activate defect groups by converting the defect groups into reactive groups. This step may not be necessary if the defect group is a reactive group.

In step 220 the defect group, or a reactive group formed from the defect group, is reacted to form a separating group. The separating group forms selectively on polymer chains carrying the defect group or a reactive group formed from the defect group. The separating group provides a property difference between polymer chains with and without the separating group. The difference may be a difference in a physical property, for example a solubility difference, or a chemical difference, for example a reactivity difference. Polymer chains that are substantially free of defect groups are preferably unchanged by exposure to the materials used to convert the defect group into a reactive group or to react the reactive group to form the separating group.

In step 230 the semiconducting polymer is treated such that one of polymer chains with and polymer chains without the separating group undergoes a physical or chemical change whereas the other of the polymer chains with and polymer chains without the separating group remains substantially unchanged by the treatment.

The physical or chemical change enables separation of polymer chains with and polymer chains without the separating group in step 240.

FIG. 3A illustrates a process according to an embodiment of the invention wherein the separating group is a binding group.

In an optional step 310, a semiconducting polymer containing a proportion of polymer chains having defect groups is reacted to convert the defect groups into reactive groups.

In step 320 the defect groups, or the reactive groups formed from the defect groups, are reacted to form binding groups X on the polymer that are capable of binding to a solid substrate material. In one embodiment, the defect group is incapable of bonding to the solid substrate material and is converted to a binding group X. In another embodiment, the defect group is capable of bonding relatively weakly to the solid substrate material and is treated to convert the defect group to a binding group X that binds relatively strongly to the solid substrate material.

In step 330 a solution of the semiconducting polymer containing polymer chains having binding groups X dissolved in a solvent of a single solvent material or a mixture of solvent materials is brought into contact with a solid substrate capable of binding to binding group X.

The solid substrate may consist of a material capable of binding to binding to group X or may have a surface layer capable of binding to group X. The surface of the solid substrate may carry binding groups Y capable of binding to binding group X. The binding group X binds to the solid substrate, and polymer chains without binding groups X do not bind to the solid substrate and may be separated from the substrate in step 340.

The bond formed between binding group X and the solid substrate may be a van der Waals bond, a covalent bond an ionic bond or a dative bond, preferably an ionic or covalent bond, more preferably a covalent bond. It will be understood that the bond strength between binding group X and the solid substrate is strong enough to prevent the polymer containing the defect group from being washed off the solid substrate by the solvent of the solution.

Figure 3B:
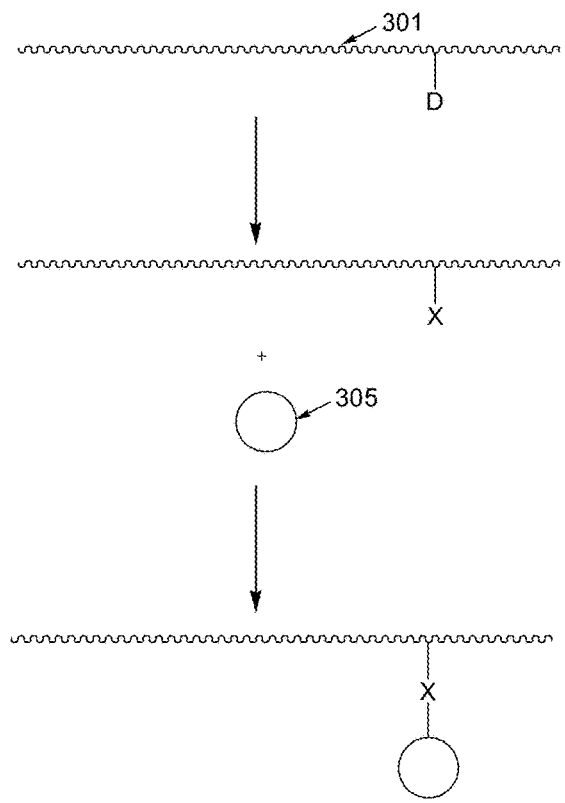
FIG. 3B is a schematic illustration of the process of FIG. 3A.

FIG. 3B schematically illustrates conversion of a defect group D of a polymer chain 301 into a binding group X and binding of group X to a particle of a solid substrate material 305. For simplicity, polymer chains without defects are not illustrated in FIG. 3B however it will be appreciated that polymer chains carrying defect groups will be present in combination with polymer chains that are substantially free of defects and that are preferably not changed by exposure to the materials used to convert defect group D into binding group X, or by exposure to the solid substrate material.

In the embodiment illustrated in FIG. 3B the solid substrate is formed from a particulate material 305. The polymer solution may be passed through a column of particulate substrate material to bind group X to the particulate material. In other embodiments, the solid substrate may be a bulk material that the polymer solution is contacted with.

Figure 3C:
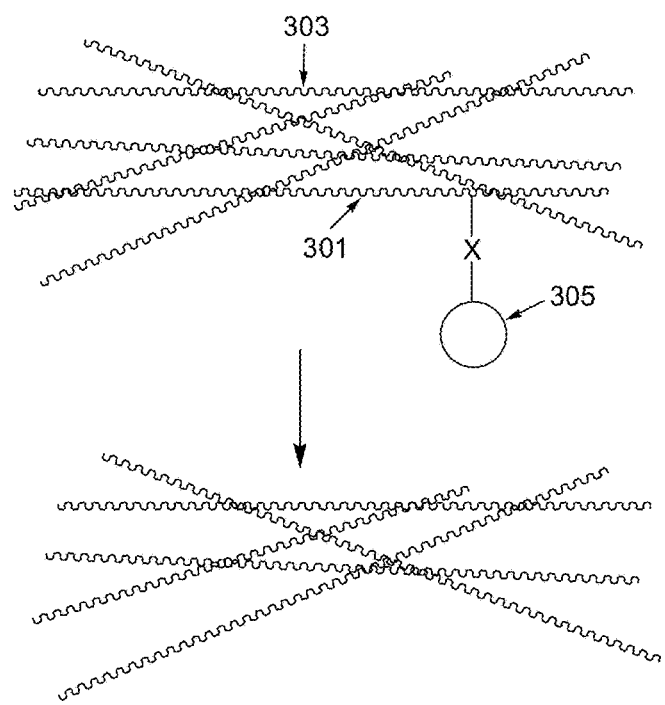
FIG. 3C is a schematic illustration of polymer chain separation according to the process of FIG. 3A.

With reference to FIG. 3C, polymer chains 301 bound to the solid substrate material 305 may be separated from polymer chains 303 that are substantially free of defects. Separation may be effected by filtration. Separation may be effected by passing the polymer solution through a column such that polymer chains 301 carrying binding groups X derived from defect groups D are bound to the solid substrate material and polymer chains 303 that are substantially free of binding groups pass through the column.

The solid substrate may be silica. A suitable binding group X for binding to silica is a group of formula —$SiR_3$ wherein R independently in each occurrence is a substituent with the proviso that at least one R is a $C_{1-10}$ alkoxy, hydroxy, or similar group.

A wide range of chemistries can be used to create a bond between a defect group and binding group X, and may be a reaction between the defect group and a reagent comprising the binding group X and a reactive group capable of reacting with the defect group to form a bond, preferably a covalent bond, to the polymer. The reagent for forming a bond between the polymer and binding group X may have formula (II):

(II)

wherein RG is a reactive group capable of reacting with the defect group; Sp is a spacer group, optionally a $C_{1-20}$ alkylene group wherein one or more non-adjacent C atoms may be replaced with O, C=O or COO; n is 0 or 1; and X is the binding group.

The defect group may be a group comprising an acidic proton. Exemplary groups carrying an acidic proton are hydroxyl, primary amino groups and secondary amino groups.

Defect groups carrying an acidic proton, or reactive groups derived from the defect groups carrying an acidic proton, may be reacted with a compound of formula Hal-$SiR_3$ wherein Hal is a halogen, optionally chlorine, bromine or iodine to form a binding group X of formula —$SiR_3$. Preferably, the group that remains after the removal of the acidic proton has sufficient nucleophilic characteristic to be able to react with and remain bonded to the Si—$R_3$ moiety.

Reactions can summarised into the main categories of nucleophile/electrophile reactions and condensation reactions and sigmatropic reactions, although this invention is not limited to these categories.

The reaction between an electrophile and a nucleophile is a widespread concept in organic chemistry, and numerous example can be considered. This is a particularly important class of reactions for this invention as many of the likely defects are hydroxyls or similar structures and can therefore act as nucleophiles. Potential examples include but are not limited the examples given below.

A hydroxyl group has a degree of intrinsic nucleophilicity, and this can optionally be enhanced by the use of a base to remove the acidic proton at some point during the reaction. A nucleophile of this type can react with a range of electrophiles, including but not limited to alkyl halides, acid chlorides, pseudohalides such as tosylates and other compounds with good leaving groups. Other electrophilic species include silyl halides and related species. In this later case the silyl group that is introduced can itself directly react subsequently onto the solid substrate material, or can be connected to the binding group X by a linking group such as an alkyl chain.

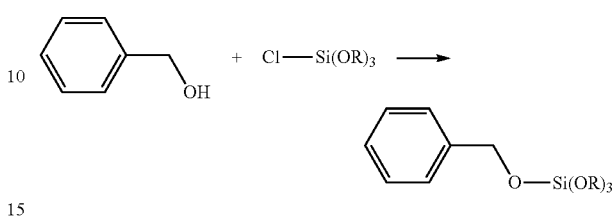

Condensation reactions typically involve the release of a molecule of water and example reactions are between a carbonyl (typically an aldehyde or ketone) and an amine or a hydrazine. An example of when this reaction would be helpful would be after a photo-oxidation event has left a carbonyl group on an alkyl chain.

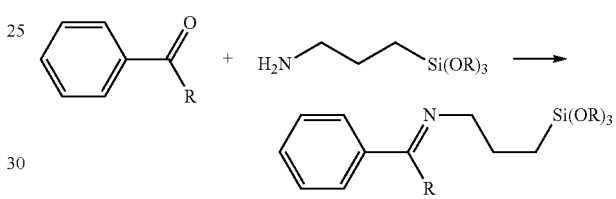

It will be appreciated that other functional groups can condense with a carbonyl in this manner, with the main requirement being that two hydrogen atoms are available on an appropriate molecule. These could be on the same atom as in the case with the NH2 group illustrated above, or could be on neighbouring atoms. Examples of these would include diols (typically, though not restricted to 1,2 or 1,3) which can condense to form an acetal or ketal, or dithiols, or activated C—H compounds (such as a 1,3-dicarbonyl compound) or a combination of these.

Other condensation reactions could be between a carboxylic acid or ester and a reacting molecule containing 3 or more available hydrogen atoms. For example, a derivative of 2-hydroxyethylamine could react with a carboxylic acid or derivative to form an oxazole functionality.

A sigmatropic reaction involves the rearrangement of the sigma and pi-bonds in a typically cyclic structure, for which the Diels-Alder reaction is typical. This would enable the reaction between an alkene defect and a reactive group that would typically consist of a diene that could optionally be activated. Activation for a diene is often in the form of an electron-donating group. Species that could be used to react with an alkene or alkyne impurity include substituted derivatives of butadiene, furan, thiophene, anthracene or species that can undergo reactions that form these species such as 3-sulfolene The result of the reaction of the defect group is that the polymer chain has become functionalised with the binding group X and the polymer chain that contains the defect is now activated towards binding with the solid substrate.

The solid substrate may be an ion exchange resin. A suitable group X for binding to an ion exchange resin is an ionic group, optionally an acidic group, for binding to a cation exchange resin.

Figure 4:
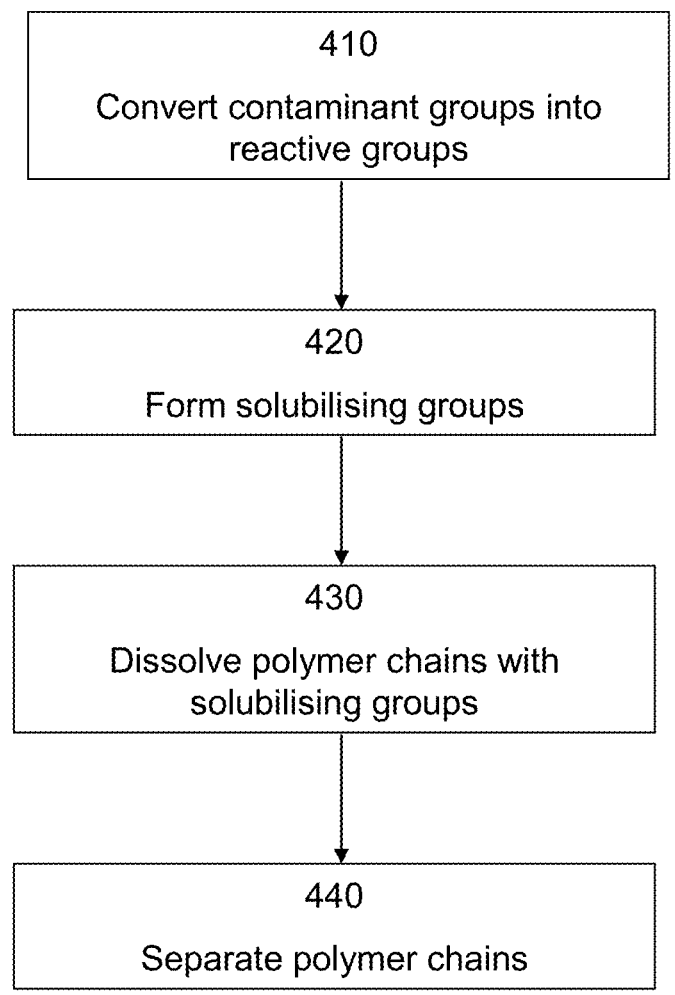
FIG. 4 is a flowchart of a process for treating a polymer by forming solubilising groups on polymer chains carrying defect groups and selectively dissolving the polymer chains carrying solubilising groups.
Figure 5:
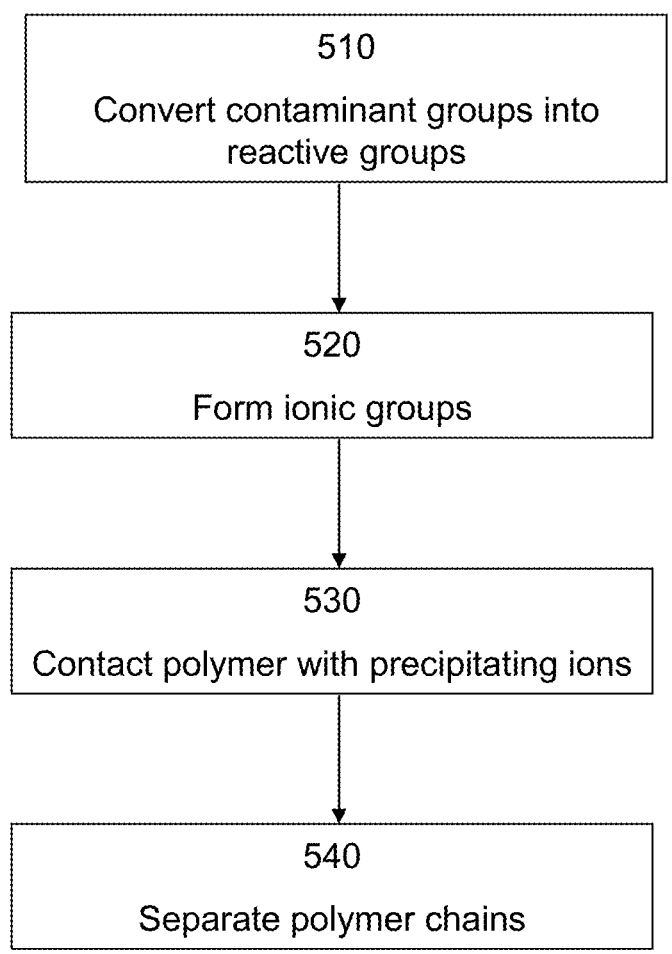
FIG. 5 is a flowchart of a process for treating a polymer by forming ionic groups on polymer chains carrying defect groups and precipitating the polymer chains by ion exchange.

FIG. 4 is a flowchart illustrating a further process according to an embodiment of the invention.

In optional step 410, a semiconducting polymer containing a proportion of polymer chains having defect groups is converted to a reactive group capable of reacting with a solubilising reagent. Step 410 may not be necessary if the defect group is capable of reacting with a solublising reagent.

In step 420, the defect groups or the reactive groups derived from the defect groups are reacted with the solubilising reagent to form a solubilising group bound to the polymer chains.

An exemplary solubilising reagent has formula (I):

(I)

wherein Z is a reactive group capable of reacting with the defect group or the reactive group derived from the defect group, and Sol is a solublising group.

The semiconducting polymer is placed in a solvent capable of dissolving polymer chains carrying solubilising group Sol in step 430. The solvent may be a single solvent material or a mixture of solvent materials.

The solubilising group Sol is selected such that the polymers carrying Sol have greater solubility in the solvent than polymer chains without the group Sol. The polymer chains carrying Sol dissolve in the solvent whereas polymer chains without the group Sol are less soluble or insoluble in the solvent.

The polymer solution is separated at step 440 from undissolved polymer to separate polymers carrying solublising groups Sol in the solution from the undissolved polymer.

If the polymer is substituted with non-polar groups, for example hydrocarbyl groups such as $C_{1-20}$ alkyl groups, then the solvent may be a polar solvent and the solubilising group Sol may be a polar group.

Preferably, the difference in solubility in g/cm$^3$ between polymer chains with and without the solubilising group Sol is preferably at least 1, optionally at least 2 or at least 3 orders of magnitude Exemplary polar solvents include water, methanol and acetone.

Exemplary polar solubilising groups include groups of formula —(O(CH2)a)b-H wherein a is 1, 2, 3 or 4 and b is at least 1, optionally 1-2000, such as —(OCH2CH2)b-H. Alternative polar solubilising groups consist of ionic groups that are highly soluble in polar solvents such as water. Further details of groups that could solubilise a lipophilic polymer in a lipophobic solvent will be known to the skilled person.

If polymer chains carrying the defect group have higher solubility in the solvent than polymer chains that do not carry the defect group then the first and second optional steps may not be necessary. In this case, the defect group is the solubilising group.

If the defect group is capable of reacting with the solubilising reagent then the first optional step may not be necessary.

In an optional step 510, a semiconducting polymer containing a proportion of polymer chains having defect groups is reacted to convert the defect group to a reactive group capable of reacting with an ionic reagent. This first step may not be necessary if the defect group is a reactive group capable of reacting with an ionic reagent.

Preferably, the defect group or the reactive group formed from the defect group is an acidic group, for example a hydroxyl group or a primary or secondary amine group.

The semiconducting polymer is dissolved at step 520 in a solvent containing a dissolved ionic compound. The cation of the ionic compound is selected to cause precipitation of a salt upon cation exchange with the ionic group of the polymer, for example exchange of the proton of an acidic group of the polymer for the cation of the dissolved ionic compound. At step 530 the polymer precipitate is separated from the solution.

Preferably, at least 0.001 mol % of the repeat units of the semiconducting polymers subjected to the process as described herein contain a defect group. Optionally, at least 0.005 mol % or at least 0.01 mol % of repeat units contain a defect group. The semiconducting polymer may contain up to 5 mol % of defect groups.

Defect levels may be measured by any appropriate analytical technique selected according to the properties of the defect concerned. Defects that contain elements that are not in the polymer backbone can be quantified using elemental analysis techniques such as XRF. The quantity of defects may be measured by NMR. Signal suppression techniques may be used to amplify the signals from the defect (or nearby groups in the polymer that can be monitored to an equivalent extent). A sample of the polymer containing defects may be analysed directly, or the analysis may be carried out on the polymer sample after the defect has been reacted to form a defect identifier group that may be identified by NMR. The reaction to form a defect identifier group may be carried out in a manner analogous to any method described herein to form a binding group. For example, a hydroxyl group can be reacted with trimethylsiyl chloride to provide a trimethylsiyl group bound to the affected polymer chain. Preferably, the percentage of repeat units containing a defect group is at least halved by the process as described herein.

Polymers as described herein suitably have a polystyrene-equivalent number-average molecular weight (Mn) measured by gel permeation chromatography in the range of about $1 \times 10^3$ to $1 \times 10^8$, and preferably $1 \times 10^3$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Polymers as described herein are preferably amorphous.

Repeat Units

Examples of repeat unit units that contain defects include, without limitation, repeat units illustrated below:

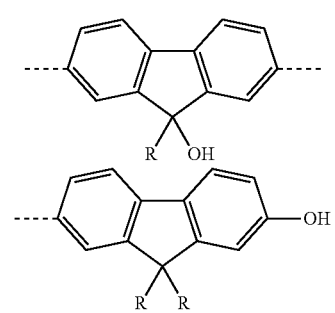

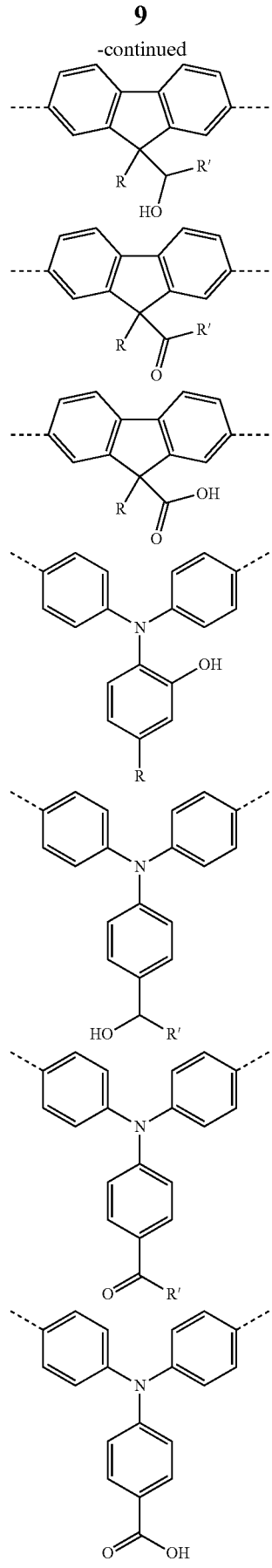

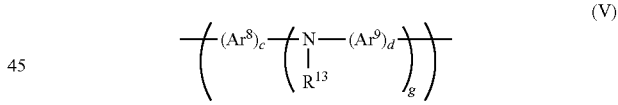

wherein R and R' independently in each occurrence is a $C_{1-40}$ hydrocarbyl group, optionally $C_{1-20}$ alkyl, unsubstituted phenyl or phenyl substituted with one or more $C_{1-10}$ alkyl groups.

Semiconducting polymers as described herein may have a conjugated or a non-conjugated backbone.

Semiconducting polymers having a non-conjugated backbone include polyethylenes or polyacrylates with semiconducting groups pendant therefrom. An example of a non-conjugated semiconducting polymer is polyvinylcarbazole.

Exemplary repeat units of conjugated polymers include arylene repeat units, for example phenylene, fluorene, naphthalene, anthracene and phenanthrene repeat units; heteroarylene repeat units; arylamine repeat units; and styrene repeat units.

The backbone of a conjugated polymer may consist essentially of arylene and/or heteroarylene repeat units or it may contain atoms or groups separating arylene or heteroarylene repeat units in the polymer backbone.

Exemplary arylamine repeat units have formula (V):

$$\left( \left( Ar^8 \right)_c \left( N{-}(Ar^9)_d \right)_g \right) \quad (V)$$
$$\qquad\qquad R^{13}$$

wherein $Ar^8$ and $Ar^9$ in each occurrence are independently selected from substituted or unsubstituted aryl or heteroaryl, g is greater than or equal to 1, preferably 1 or 2, $R^{13}$ is H, or a substituent and c and d are each independently 1, 2 or 3.

$R^{13}$, which may be the same or different in each occurrence when g>1, is preferably a substituent and is more preferably selected from the group consisting of alkyl, for example $C_{1-20}$ alkyl, $Ar^{10}$, or a branched or linear chain of $Ar^{10}$ groups, wherein $Ar^{10}$ in each occurrence is independently optionally substituted aryl or heteroaryl. Exemplary groups $R^{13}$ are $C_{1-20}$ alkyl, phenyl and phenyl substituted with one or more $C_{1-20}$ alkyl groups.

Any of $Ar^8$, $Ar^9$ and, if present, $Ar^{10}$ bound directly to a N atom in the repeat unit of formula (V) may be linked by a direct bond or a divalent linking atom or group to another of $Ar^8$, $Ar^9$ and $Ar^{10}$ bound directly to the same N atom. Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^{14}$, wherein each $R^{14}$ may independently be selected from the group consisting of substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F.

Substituted N or substituted C, where present, may be N or C substituted with a hydrocarbyl group (in the case of substituted N) or two hydrocarbyl groups (in the case of substituted C), for example a $C_{1-10}$ alkyl, unsubstituted phenyl or phenyl substituted with one or more $C_{1-10}$ alkyl groups.

Preferred repeat units of formula (V) are selected from sub-formulae 1-3:

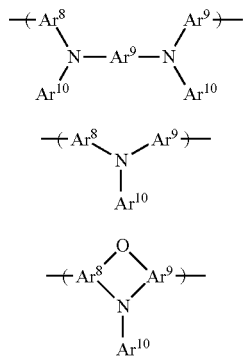

Preferably, the central $Ar^9$ group of formula 1 is phenyl or a polycyclic aromatic group and $Ar^8$, outer $Ar^9$ and $Ar^{10}$ of repeat units of formula 1 are phenyl. Preferably central $Ar^9$ of formula (I) is an optionally substituted fluorene, for example as described in WO 2005/049546 and WO 2013/108022 the contents of which are incorporated by reference.

In one preferred arrangement, $R^{13}$ is $Ar^{10}$ and each of $Ar^8$, $Ar^9$ and $Ar^{10}$ are independently unsubstituted or substituted with one or more $C_{1-20}$ alkyl groups.

$Ar^8$, $Ar^9$ and $Ar^{10}$ of formulae 2 and 3 are preferably phenyl, each of which may independently be substituted with one or more substituents as described above.

In another preferred arrangement, $Ar^8$ and $Ar^9$ are phenyl, each of which may be substituted with one or more $C_{1-20}$ alkyl groups, and $R^{13}$ is 3,5-diphenylbenzene wherein each phenyl may be substituted with one or more $C_{1-20}$ alkyl groups.

In another preferred arrangement, c, d and g are each 1 and $Ar^8$ and $Ar^9$ are phenyl linked by an oxygen atom to form a phenoxazine ring.

Amine repeat units may be provided in a molar amount in the range of about 0.5 mol % up to about 50 mol %, optionally up to 40 mol %.

Hole-transporting polymers as described herein may be homopolymers, for example homopolymers of a repeat unit comprising a group of formula (V), or may be copolymers comprising one or more co-repeat units.

Exemplary co-repeat units include arylene repeat units, for example 1,2-, 1,3- and 1,4-phenylene repeat units, 3,6- and 2,7-linked fluorene repeat units, indenofluorene, naphthalene, anthracene and phenanthrene repeat units, each of which may be unsubstituted or substituted with one or more substituents. Substituents may be selected from groups $R^7$ described below.

One preferred class of arylene repeat units is phenylene repeat units, such as phenylene repeat units of formula (X):

wherein w in each occurrence is independently 0, 1, 2, 3 or 4, optionally 1 or 2; n is 1, 2 or 3; and $R^7$ independently in each occurrence is a substituent.

Where present, each $R^7$ may independently be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups;

a linear or branched chain of aryl or heteroaryl groups, each of which groups may independently be substituted, for example a group of formula —$(Ar^3)_r$ wherein each $Ar^3$ is independently an aryl or heteroaryl group and r is at least 2, preferably a branched or linear chain of phenyl groups each of which may be unsubstituted or substituted with one or more $C_{1-20}$ alkyl groups; and a crosslinkable-group, for example a benocyclobutene group or a group comprising a double bond.

Substituted N, where present, may be —$NR^2$— wherein $R^2$ is $C_{1-20}$ alkyl; unsubstituted phenyl; or phenyl substituted with one or more $C_{1-20}$ alkyl groups.

Preferably, each $R^7$ is independently selected from $C_{1-40}$ hydrocarbyl, and is more preferably selected from $C_{1-20}$ alkyl; unsubstituted phenyl; and phenyl substituted with one or more $C_{1-20}$ alkyl groups; a linear or branched chain of phenyl groups, wherein each phenyl may be unsubstituted or substituted with one or more substituents; and a crosslinkable group.

If n is 1 then exemplary repeat units of formula (X) include the following:

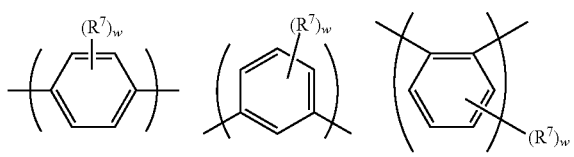

A particularly preferred repeat unit of formula (X) has formula (Xa):

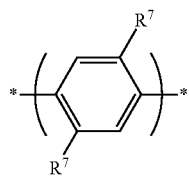

(Xa)

Substituents R⁷ of formula (Xa) are adjacent to linking positions of the repeat unit, which may cause steric hindrance between the repeat unit of formula (Xa) and adjacent repeat units, resulting in the repeat unit of formula (Xa) twisting out of plane relative to one or both adjacent repeat units.

Exemplary repeat units where n is 2 or 3 include the following:

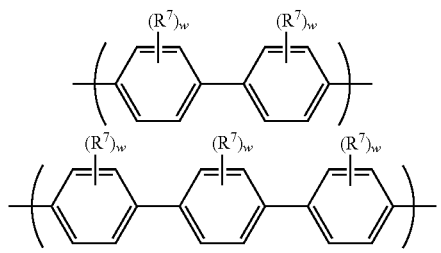

A preferred repeat unit has formula (Xb):

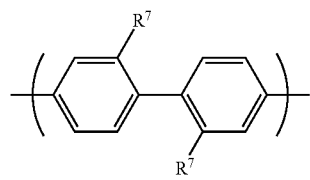

(Xb)

The two R⁷ groups of formula (Xb) may cause steric hindrance between the phenyl rings they are bound to, resulting in twisting of the two phenyl rings relative to one another.

A further class of arylene repeat units is optionally substituted fluorene repeat units, such as repeat units of formula (XI):

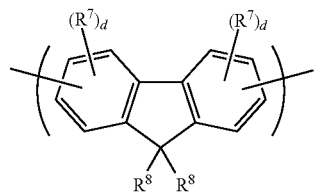

(XI)

wherein R⁸ in each occurrence is the same or different and is a substituent wherein the two groups R⁸ may be linked to form a ring; R⁷ is a substituent as described above; and d is 0, 1, 2 or 3.

Each R⁸ may independently be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups; and a linear or branched chain of aryl or heteroaryl groups, each of which groups may independently be substituted, for example a group of formula —(Ar⁷), wherein each Ar⁷ is independently an aryl or heteroaryl group and r is at least 2, optionally 2 or 3, preferably a branched or linear chain of phenyl groups each of which may be unsubstituted or substituted with one or more $C_{1-20}$ alkyl groups.

a crosslinkable-group, optionally a benocyclobutene group or a group comprising a double bond.

Preferably, each R⁸ is independently a $C_{1-40}$ hydrocarbyl group.

Different groups R⁸ are disclosed in WO 2012/104579 the contents of which are incorporated in entirety by reference.

Substituted N, where present, may be —NR²— wherein R² is as described above.

Exemplary substituents R⁷ are alkyl, for example $C_{1-20}$ alkyl, wherein one or more non-adjacent C atoms may be replaced with O, S, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

The extent of conjugation of repeat units of formula (XI) to aryl or heteroaryl groups of adjacent repeat units in the polymer backbone may be controlled by (a) linking the repeat unit through the 3- and/or 6-positions to limit the extent of conjugation across the repeat unit, and/or (b) substituting the repeat unit with one or more substituents R⁸ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (XI) may be a 2,7-linked repeat unit of formula (XIa):

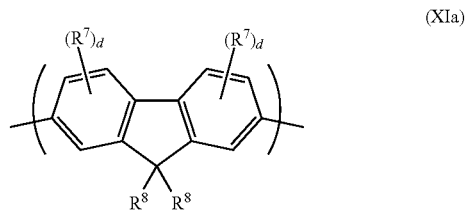

(XIa)

Optionally, the repeat unit of formula (XIa) is not substituted in a position adjacent to the 2- or 7-position. A relatively high degree of conjugation across the repeat unit of formula (XIa) may be provided in the case where each d=0, or where any substituent R⁷ is not present at a position adjacent to the linking 2- or 7-positions of formula (XIa).

Conjugation across the repeat unit of formula (XIa) may be limited in the case where at least one d is at least 1, and where at least one substituent R⁷ is present at a position adjacent to the linking 2- or 7-positions of formula (XIa).

Optionally, each d is 1 and the 5- and/or 6-position of the repeat unit of formula (XIa) is substituted with a substituent R⁷ to provide a relatively low degree of conjugation across the repeat unit. Substitutions at the 5- and/or 6-positions is disclosed in WO 2013/191086 the contents of which are incorporated herein by reference.

The repeat unit of formula (XI) may be a 3,6-linked repeat unit of formula (XIb)

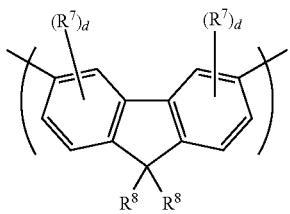

(XIb)

The extent of conjugation across a repeat unit of formula (XIb) may be relatively low as compared to a corresponding repeat unit of formula (XIa).

Another exemplary arylene repeat unit has formula (VIII):

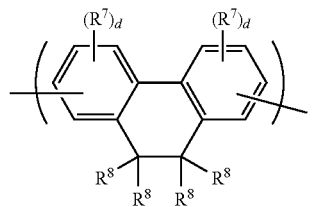

(VIII)

wherein $R^7$, $R^8$ and d are as described with reference to formulae (X) and (XI) above. Any of the $R^7$ groups may be linked to any other of the $R^7$ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

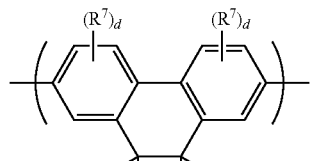

(VIIIa)

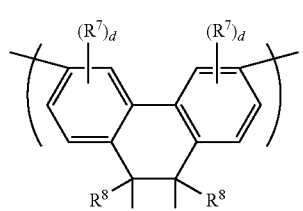

(VIIIb)

The one or more co-repeat units may include a conjugation-breaking repeat unit, which is a repeat unit that does not provide any conjugation path between repeat units adjacent to the conjugation-breaking repeat unit.

Polymer Synthesis

One method of forming conjugated polymers as described herein is Suzuki polymerisation, for example as described in WO 00/53656 or U.S. Pat. No. 5,777,070 which allows formation of C—C bonds between two aromatic or heteroaromatic groups, and so enables formation of polymers having conjugation extending across two or more repeat units. Suzuki polymerisation takes place in the presence of a palladium complex catalyst and a base.

As illustrated in Scheme 1, in the Suzuki polymerisation process a monomer for forming repeat units RU1 has two leaving groups LG1 such as boronic acid or boronic ester group bound to the same or different arylene or heteroarylene groups of RU1, and a monomer for forming repeat units RU2 has two leaving groups LG2 such as halogen, sulfonic acid or sulfonic ester bound to the same or different arylene or heteroarylene groups of RU1. The monomers are polymerised to form a carbon-carbon bond between arylene or heteroarylene groups of or RU 1 and RU 2:

Scheme 1

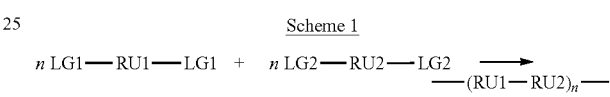

Exemplary boronic esters have formula (VI):

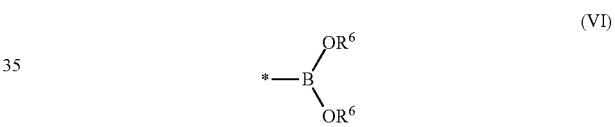

(VI)

wherein $R^6$ in each occurrence is independently a $C_{1-20}$ alkyl group, * represents the point of attachment of the boronic ester to an aromatic ring of the monomer, and the two groups $R^6$ may be linked to form a ring. In a preferred embodiment, the two groups $R^6$ are linked to form the pinacol ester of boronic acid:

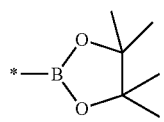 [SMILES: *B1OC(C)(C)C(C)(C)O1]

It will be understood by the skilled person that a monomer LG1-RU1-LG1 will not polymerise to form a direct carbon-carbon bond with another monomer LG1-RU1-LG1. A monomer LG2-RU2-LG2 will not polymerise to form a direct carbon-carbon bond with another monomer LG2-RU2-LG2.

Preferably, one of LG1 and LG2 is bromine or iodine and the other is a boronic acid or boronic ester.

This selectivity means that the ordering of repeat units in the polymer backbone can be controlled such that all or substantially all RU1 repeat units formed by polymerisation of LG1-RU1-LG1 are adjacent, on both sides, to RU2 repeat units.

In the example of Scheme 1 above, an AB copolymer is formed by copolymerisation of two monomers in a 1:1 ratio, however it will be appreciated that more than two or more than two monomers may be used in the polymerisation, and any ratio of monomers may be used.

In the example of Scheme 1 above, a linear copolymer is formed. In other embodiments, one or more monomers may contain 3 or more leaving groups to form a branching polymer.

The base may be an organic or inorganic base. Exemplary organic bases include tetra-alkylammonium hydroxides, carbonates and bicarbonates. Exemplary inorganic bases include metal (for example alkali or alkali earth) hydroxides, carbonates and bicarbonates.

The palladium complex catalyst may be a palladium (0) or palladium (II) compound.

Particularly preferred catalysts are tetrakis(triphenylphosphine)palladium (0) and palladium (II) acetate mixed with a phosphine.

A phosphine may be provided, either as a ligand of the palladium compound catalyst or as a separate compound added to the polymerisation mixture. Exemplary phosphines include triarylphosphines, for example triphenylphosphines wherein each phenyl may independently be unsubstituted or substituted with one or more substituents, for example one or more $C_{1-5}$ alkyl or $C_{1-5}$ alkoxy groups.

Particularly preferred are triphenylphospine and tris(ortho-methoxytriphenyl) phospine.

A further polymerisation method is Yamamoto polymerisation in which monomers carrying halogen (preferably bromine) leaving groups react in the presence of a nickel catalyst.

The polymerisation reaction may take place in a single organic liquid phase in which all components of the reaction mixture are soluble. The reaction may take place in a two-phase aqueous-organic system, in which case a phase transfer agent may be used. The reaction may take place in an emulsion formed by mixing a two-phase aqueous-organic system with an emulsifier.

The polymer may be end-capped by addition of an endcapping reactant. Suitable end-capping reactants are aromatic or heteroaromatic materials substituted with only one leaving group. The end-capping reactants may include reactants substituted with a halogen for reaction with a boronic acid or boronic ester group at a polymer chain end, and reactants substituted with a boronic acid or boronic ester for reaction with a halogen at a polymer chain end. Exemplary end-capping reactants are halobenzenes, for example bromobenzene, and phenylboronic acid. End-capping reactants may be added during or at the end of the polymerisation reaction.

Light-Emitting Layers

An OLED may contain one or more light-emitting layers. Suitable light-emitting materials for a light-emitting layer include polymeric, small molecule and dendrimeric light-emitting materials, each of which may be fluorescent or phosphorescent.

A light-emitting layer of an OLED may be unpatterned, or may be patterned to form discrete pixels. Each pixel may be further divided into subpixels. The light-emitting layer may contain a single light-emitting material, for example for a monochrome display or other monochrome device, or may contain materials emitting different colours, in particular red, green and blue light-emitting materials for a full-colour display.

A light-emitting layer may contain a mixture of more than one light-emitting material, for example a mixture of light-emitting materials that together provide white light emission.

A blue light emitting material may have a photoluminescent spectrum with a peak in the range of 400-490 nm.

A green light emitting material may have a photoluminescent spectrum with a peak in the range of more than 490 nm up to 580 nm.

A red light emitting material may optionally have a peak in its photoluminescent spectrum of more than 580 nm up to 650 nm, preferably 600-630 nm.

The photoluminescence spectrum of a material may be measured by casting 5 wt % of the material in a PMMA film onto a quartz substrate to achieve transmittance values of 0.3-0.4 and measuring in a nitrogen environment using apparatus C9920-02 supplied by Hamamatsu.

Exemplary fluorescent polymeric light-emitting materials include semiconducting polymers as described herein, optionally polymers comprising one or more of arylene repeat units, arylene vinylene repeat units and arylamine repeat units.

A fluorescent light-emitting layer may consist of a light-emitting material alone or may further comprise one or more further materials mixed with the light-emitting material. Exemplary further materials may be selected from hole-transporting materials; electron-transporting materials and triplet-accepting materials. A fluorescent light-emitting polymer may be mixed with a triplet-accepting additive, optionally a triplet accepting polymer, for example a triplet-accepting material as described in WO 2013/114118, the contents of which are incorporated herein by reference.

Preferred light-emitting polymers are copolymers comprising one or more repeat units selected from formulae (X), (XI) and (VIII) and (V) described above; phenanthrene repeat units; naphthalene repeat units; anthracene repeat units; and perylene repeat units. Each of these repeat units may be linked to adjacent repeat units through any two of the aromatic carbon atoms of these units. Specific exemplary linkages include 9,10-anthracene; 2,6-anthracene; 1,4-naphthalene; 2,6-naphthalene; 2,7-phenanthrene; and 2,5-perylene. Each of these repeat units may be substituted or unsubstituted, for example substituted with one or more $C_{1-40}$ hydrocarbyl groups.

The light-emitting layer may contain a host material and a fluorescent or phosphorescent dopant. The host material may be a non-polymeric or polymeric host. Exemplary hosts are semiconducting polymers as described herein, optionally polymers comprising one or more repeat units selected from formulae (V), (XIII), (X) and (XI). Exemplary phosphorescent light-emitting materials are transition metal complexes, preferably complexes of ruthenium, rhodium, palladium, rhenium, osmium, iridium, platinum and gold. Iridium is particularly preferred.

Hole Injection Layers

A conductive hole injection layer, which may be formed from a conductive organic or inorganic material, may be provided between the anode and the light-emitting layer or layers of an OLED to improve hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Where a hole-transporting layer is present, a hole-injection layer may be provided between the anode and the hole-transporting layer.

Charge Transporting and Charge Blocking Layers

A hole transporting layer may be provided between the anode and the light-emitting layer or layers. An electron transporting layer may be provided between the cathode and the light-emitting layer or layers.

An electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A hole-transporting polymer of a hole-transporting layer may be a semiconducting polymer as described herein and may comprise one or more repeat units of formula (V). A polymer comprising repeat units of formula (V) may comprise one or more arylene co-repeat units, optionally one or more co-repeat units selected from repeat units of formula (X), (XI) and (VIII).

A hole transporting layer preferably has a HOMO level of less than or equal to 5.5 eV, more preferably around 4.8-5.5 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers. The hole-transporting layer may be a polymer comprising repeat units of formula (I) as described above.

An electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

An electron transporting layer may contain a polymer comprising a chain of optionally substituted arylene repeat units, such as a chain of fluorene repeat units.

Cathode

The cathode is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of conductive materials, for example a plurality of conductive metals such a bilayer of a low workfunction material and a high workfunction material such as calcium and aluminium as disclosed in WO 98/10621. The cathode may comprise a layer of elemental barium, for example as disclosed in WO 98/57381, Appl. Phys. Lett. 2002, 81(4), 634 and WO 02/84759. The cathode may comprise a thin (e.g. 1-5 nm) layer of metal compound between the organic semiconducting layers and one or more conductive cathode layers, in particular an oxide or fluoride of an alkali or alkali earth metal, to assist electron injection, for example lithium fluoride, for example as disclosed in WO 00/48258; barium fluoride, for example as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A better material for absorption of any atmospheric moisture and/or oxygen that may permeate through the substrate or encapsulant may be disposed between the substrate and the encapsulant.

Formulation Processing

A semiconducting polymer as described herein may be deposited from a formulation comprising the polymer and one or more solvents to form a layer of an organic electronic device. The formulation may be a solution of the components of the layer in question, or may be a dispersion in the one or more solvents in which one or more components are not dissolved. Preferably, the formulation is a solution. The formulation may consist of the polymer and the one or more solvents or may contain one or more further components.

Particularly preferred solution deposition techniques including printing and coating techniques such spin-coating and inkjet printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, slot die coating, roll printing and screen printing.

EXAMPLES

Comparative Polymer 1

A polymer containing comprising fluorene repeat units of formula (XIa), a repeat unit of formula (VIIIa), a repeat unit of formula (V-1) and a repeat unit of formula (V-3) was prepared by Suzuki polymerisation as described in WO 00/53656. The reaction environment was not controlled to prevent entry of oxygen into the reaction vessel.

The quantity of hydroxyl defect groups in the polymer as measured by NMR was 0.038 mol %.

Polymer Example 1

A solution of Comparative Polymer 1 was treated by stirring with triethylamine and Cl—Si(OEt)$_3$ overnight and passed through a column containing finely divided silica.

The quantity of hydroxyl defect groups was re-measured following treatment as 0.0091 mol %.

Comparative Polymer 2

A polymer was synthesised and treated as described as for Comparative Polymer 1 except that entry of oxygen into the reaction vessel was prevented.

Comparative Polymer 1 is substantially free of defect hydroxyl groups.

Comparative Polymer 3

Comparative Polymer 2 was treated as described for Polymer Example 1 to give Comparative Polymer 3.

Device Example 1

A blue organic light-emitting device having the following structure was prepared:
ITO/HIL/HTL/LE/Cathode
wherein ITO is an indium-tin oxide anode; HIL is a hole-injecting layer; HTL is a hole-transporting layer; LE is a light-emitting layer; and the cathode comprises a layer of sodium fluoride in contact with the light-emitting layer and a layer of silver and a layer of aluminium.

To form the device, a substrate carrying ITO was cleaned using UV/Ozone. The hole injection layer was formed by spin-coating an aqueous formulation of a hole-injection material available from Plextronics, Inc. and heating the resultant layer. The hole transporting layer was formed by spin-coating a polymer comprising phenylene repeat units of formula (Xa), amine repeat units of formula (V-1) and crosslinkable repeat units of formula (XIa) and crosslinking the polymer by heating. The light-emitting layer was formed by spin-coating Polymer Example 1 and an additive polymer. The cathode was formed by evaporation of a first layer of sodium fluoride to a thickness of about 2 nm, a second layer of aluminium to a thickness of about 100 nm and a third layer of silver to a thickness of about 100 nm.

Comparative Devices 1-3

For the purpose of comparison, Comparative Devices 1, 2 and 3 were prepared as described for Device Example 1 except that Comparative Polymers 1, 2 and 3 respectively were used in place of Polymer Example 1.

Figure 6A:
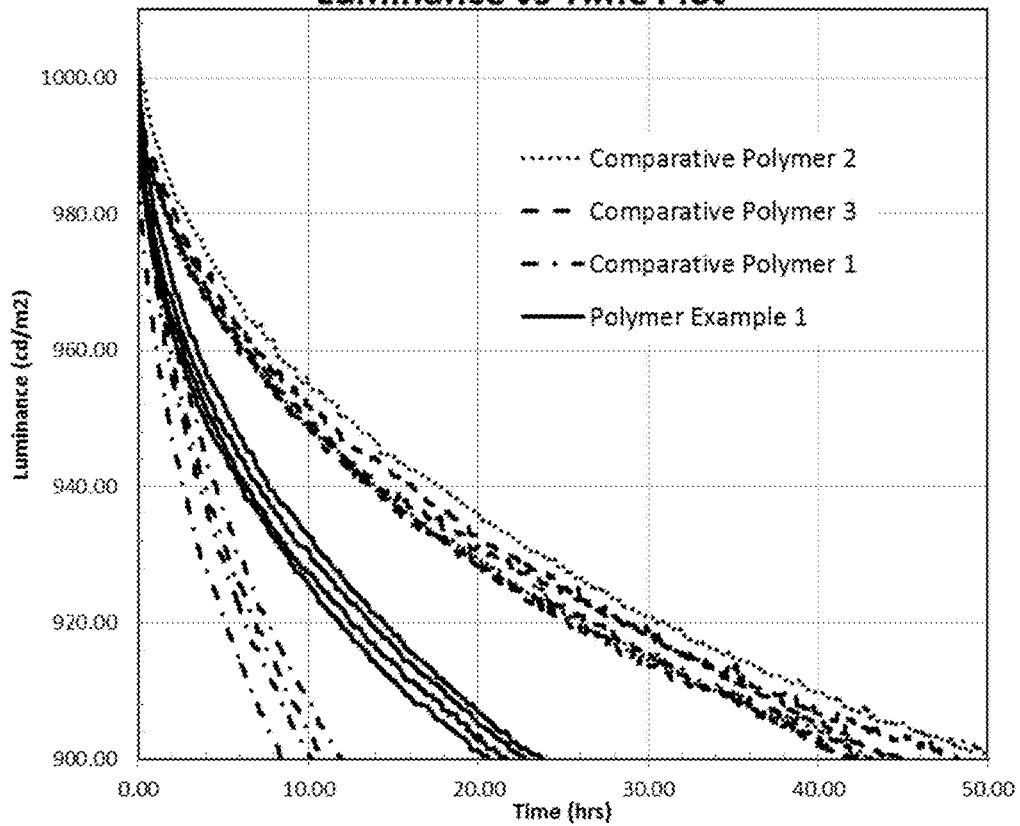
FIG. 6A is a graph showing time taken for brightnesses of a device according to an embodiment of the invention and comparative devices to fall to 90% of an initial brightness.
Figure 6B:
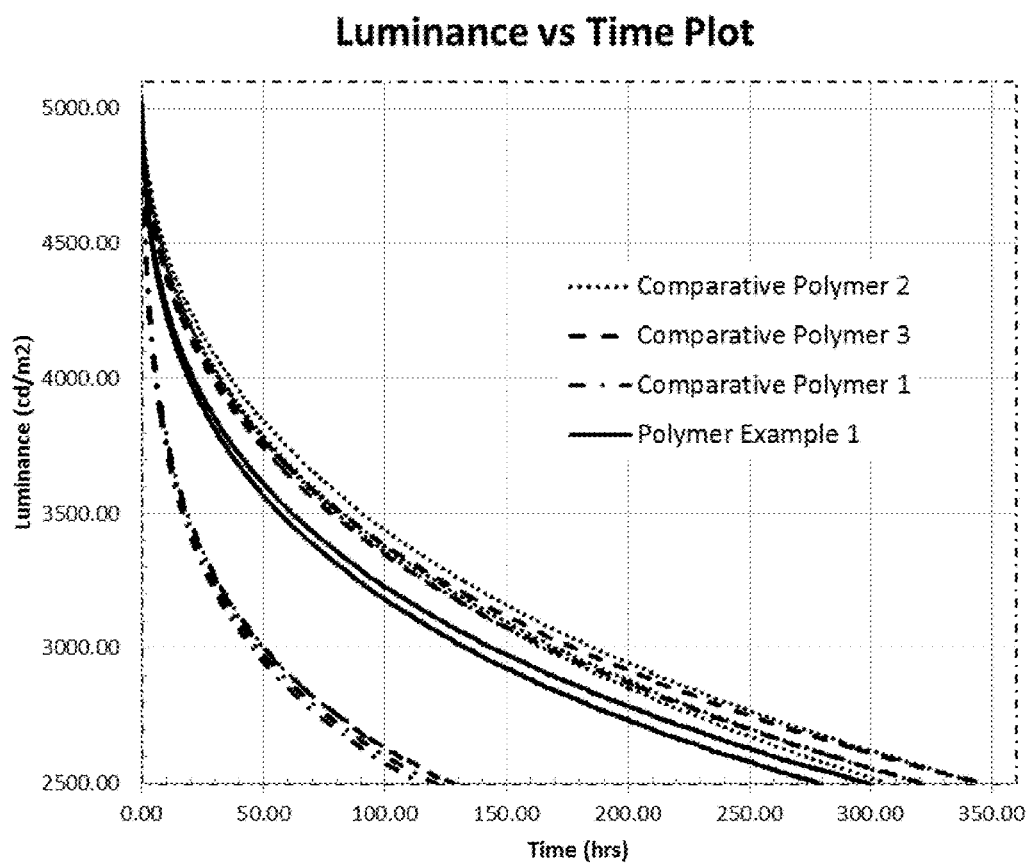
FIG. 6B is a graph showing time taken for brightnesses of a device according to an embodiment of the invention and comparative devices to fall to 50% of an initial brightness.

With reference to FIGS. 6A and 6B, the time taken for brightness to fall to 90% and to 50% respectively of a starting brightness for the device containing Polymer Example 1 is about double that of Comparative Device 1.

There is little difference between lifetimes for Comparative Devices 2 and 3, indicating that the treatment step has little or no adverse effect on the polymer.

Use in OLEDs of semiconducting polymers obtained by the process described herein has been described however it will be understood that the semiconducting polymers obtained by this process may be used in other organic semiconducting devices including, without limitation, organic field effect transistors, organic photovoltaic devices and organic photosensors.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A method of treating a semiconducting polymer, wherein the semiconducting polymer comprises polymer chains comprising a defect group and polymer chains which are substantially free of defect groups; the method comprising the steps of:
    reacting the polymer chains comprising a defect group to form polymer chains comprising separating groups; and
    separating the polymer chains comprising the separating groups from the semiconducting polymer;
    wherein the semiconducting polymer is in a dissolved form.

2. A method according to claim 1 wherein the semiconducting polymer is a conjugated polymer.

3. A method according to claim 2 wherein the semiconducting polymer comprises arylene repeat units.

4. A method according to claim 3 wherein the arylene repeat units are selected from phenylene repeat units and fluorene repeat units.

5. A method according to claim 2 wherein the semiconducting polymer comprises arylamine repeat units.

6. A method according to claim 1 wherein the defect group is a group selected from hydroxyl, primary amine and secondary amine.

7. A method according to claim 1 wherein at least 0.001 mol % of the repeat units of the semiconducting polymer prior to treatment comprise a defect group.

8. A method according to claim 1 wherein the concentration of repeat units of the semiconducting polymer containing a defect group is reduced by at least 50% following separation of the polymer chains carrying the separating groups.

9. A method according to claim 1 wherein the separating group is a binding group and wherein the polymer chains comprising the binding group are separated by binding the binding groups to a solid substrate material.

10. A method according to claim 9 wherein the solid substrate material is silica.

11. A method according to claim 9 wherein the solid substrate material is a particulate material.

12. A method according to claim 9 wherein the binding group is a group of formula —$SiR_3$ wherein R independently in each occurrence is a substituent with the proviso that at least one R is a $C_{1-10}$ alkoxy group.

13. A method according to claim 12 wherein the binding group is formed by reacting the polymer with a compound of formula X—$SiR_3$ wherein X is a halogen.

14. A method according to claim 9 wherein the separating group is an ionic group and the solid substrate is an ion exchange resin.

15. A method according to claim 1 wherein the separating group is a solubilising group and the polymer is fractionated by selectively dissolving the polymer chains comprising the solubilising group in a solvent.

16. A method according to claim 15 wherein the solubilising group is a polar group and the solvent is a polar solvent.

* * * * *